United States Patent
Hamaguchi et al.

(10) Patent No.: US 6,617,034 B1
(45) Date of Patent: Sep. 9, 2003

(54) SOI SUBSTRATE AND METHOD FOR PRODUCTION THEREOF

(75) Inventors: Isao Hamaguchi, Futtsu (JP); Atsushi Ikari, Futtsu (JP); Atsuki Matsumura, Futtsu (JP); Keisuke Kawamura, Futtsu (JP); Takayuki Yano, Futtsu (JP); Yoichi Nagatake, Futtsu (JP)

(73) Assignee: Nippon Steel Corporation, Tokyo (JP)

( * ) Notice: Subject to any disclaimer, the term of this patent is extended or adjusted under 35 U.S.C. 154(b) by 0 days.

(21) Appl. No.: 09/601,441

(22) PCT Filed: Feb. 2, 1999

(86) PCT No.: PCT/JP99/00430
§ 371 (c)(1),
(2), (4) Date: Aug. 1, 2000

(87) PCT Pub. No.: WO99/39380
PCT Pub. Date: Aug. 5, 1999

(30) Foreign Application Priority Data

Feb. 2, 1998 (JP) ............................. 10-020862
Aug. 18, 1998 (JP) ............................. 10-231828

(51) Int. Cl.⁷ .............................................. H01L 21/265

(52) U.S. Cl. ....................... 428/446; 428/448; 438/480; 438/766

(58) Field of Search ..................... 428/446, 448; 117/930; 438/765, 766, 480

(56) References Cited

U.S. PATENT DOCUMENTS

| | | | | |
|---|---|---|---|---|
| 5,015,346 A | * | 5/1991 | Gullinger et al. | 204/129.1 |
| 5,344,524 A | * | 9/1994 | Sharma et al. | 156/630 |
| 5,478,408 A | * | 12/1995 | Mitani et al. | 448/33.3 |
| 5,658,809 A | * | 8/1997 | Nakashima et al. | 438/766 |
| 5,930,643 A | * | 7/1999 | Sadana et al. | 438/407 |
| 5,966,624 A | * | 10/1999 | Shen | 438/478 |

FOREIGN PATENT DOCUMENTS

| | | | |
|---|---|---|---|
| JP | 5-345699 | | 12/1993 |
| JP | 6-279188 | | 10/1994 |
| JP | 8-46161 | | 2/1996 |
| JP | 8-306752 | | 11/1996 |
| JP | 8-321594 | | 12/1996 |
| JP | 409064319 A | * | 3/1997 |
| JP | 10-500254 | | 1/1998 |

* cited by examiner

Primary Examiner—Deborah Jones
Assistant Examiner—Stephen Stein
(74) Attorney, Agent, or Firm—Kenyon & Kenyon

(57) ABSTRACT

A SOI substrate of high quality which allows LSI to be formed thereon in an improved yield and realizes excellent electric properties and a method for the production thereof are provided. The SOI substrate is obtained by forming an embedded oxide layer on a silicon single crystal substrate and forming a SOI layer for the formation of a device on the embedded oxide layer and is characterized by the SOI layer containing pit-like defects at a density of not more than 5 cm$^{-2}$ or the embedded oxide layer containing pinhole defects at a density of less than one piece/cm$^2$.

4 Claims, 1 Drawing Sheet

SOI SUBSTRATE AND METHOD FOR PRODUCTION THEREOF

TECHNICAL FIELD

This invention relates to a SOI substrate having an embedded oxide layer disposed in the neighborhood of the surface of a silicon substrate and a silicon layer formed thereon (hereinafter referred to as a silicon-on-insulator (SOI) layer) and a method for the production thereof.

BACKGROUND ART

As SOI substrates having a single crystal silicon layer formed on such an insulator as silicon oxide, a bonded wafer and a SIMOX (separation by implanted oxygen) wafer have been mainly known. The bonded wafer is obtained by causing adhesion of two single crystal silicon wafers across an oxide film and converting either of the two wafers into a thin film. The SIMOX wafer is obtained by introducing oxygen ions into a single crystal silicon substrate by the injection of oxygen ions and causing a chemical reaction between the oxygen ions and the silicon atoms by an annealing treatment to be subsequently performed thereby giving rise to an embedded oxide film therein.

The metal-oxide-semiconductor field effect transistor (MOSFET) formed in the SOI layer of the SOI substrate possesses high resistance to radiation and to latch-up, manifests high reliability, represses the short channel effect brought by miniaturization of device, and permits an operation at a low power consumption. Thus, the SOI substrate promises as a high-performance semiconductor substrate for use in the MOS-LSI of the next generation.

(1) The MOSFET which is the basic component of a MOS-LSI is disabled to fulfill the function of a transistor when the dielectric withstanding of the oxide film under the gate electrode is not retained. Then, the whole LSI is no longer capable of retaining a normal function. As the quality of the semiconductor substrate used in the MOS-LSI, therefore, the withstanding voltage of the gate oxide film of the MOSEFT formed on the semiconductor substrate is required to secure in a fully satisfactory yield throughout the entire surface of the wafer. It has been pointed out that in the mirror wafer produced by the ordinary Czochralski process, such as-grown defects as crystal originated particles (COP) which are introduced into a crystal during the growth thereof form a factor deterioration of the withstanding voltage of the gate oxide film. The mirror wafers, therefore, have been required to reduce the density of such as-grown defects and repress the generation of poor insulation in the gate oxide film.

As regards the SOI substrate, the conditions for the formation of an embedded oxide film, the strength of lamination, the adhesion of extraneous matter, and the pollution with an introduced metal have attracted attention as problems and the improvements directed to the solution thereof have been promoted. Since no sufficient investigation has been conducted concerning the factors which are responsible for the degradation of the withstanding voltage of the gate oxide film of the MOSFET on the SOI substrate, however, the remedies produced to date in improving the oxide film in quality enough for alleviating the deficiency of the oxide film in withstanding voltage have been insufficient.

Further, the SOI substrate used for the MOS-LSI is required to avoid causing incorrect focusing at the step of lithography used in the process for production of LSI, generating etching trouble due to uneven etching at the step of etching, or entailing such a defect as to form a cause for inferior film deposition.

(2) The MOS-LSI manufactured on the SOI substrate has the device forming region thereof electrically insulated from the substrate proper through the medium of the embedded oxide layer which is an insulator. It is, therefore, capable of improving the resistance to radiation and the resistance to latch-up mentioned above and realizing such outstanding characteristics as the ability to operate with a low power consumption. For the realization of such outstanding characteristics, therefore, the MOS-LSI is required to secure the insulating performance of the embedded oxide layer in a sufficient yield throughout the entire surface of the wafer. Such as-grown defects as, for example, crystal originated particles (COP) which are introduced into a crystal during the growth thereof are present in the mirror wafer which is produced by the ordinary Czochralski process. It has been pointed out that these defects result in degrading the quality of the oxide layer as by impairing the quality of an isolation film, i.e. LOCOS (local oxidation of silicon) film. The mirror wafer, therefore, is required to reduce the density of such as-grown defects and repress the occurrence of inferior insulation of a varying oxide layer.

As regards the SOI substrate, the conditions for the formation of an embedded oxide film, the strength of lamination, the adhesion of extraneous matter, and the pollution with an introduced metal have attracted attention as problems and the improvements directed to the solution thereof have been promoted. The effect of a crystal defect on the embedded oxide layer, however, has not been studied satisfactorily.

This invention, therefore, is aimed at reducing such disadvantages and providing a SOI substrate of high quality for use in a high-performance LSI and a method therefor.

DISCLOSURE OF INVENTION (1) We have found that the as-grown defects present in a crystal prior to the formation of a SOI structure are deformed into visible pits during the process of forming the SOI structure and consequently suffered to exert adverse effects on the device characteristics.

(2) We have found that the as-grown defects present in a crystal prior to the formation of a SOI structure exert an adverse effect on the injected oxygen profile in the case of the SIMOX process or generate defects in the surface oxide layer in the case of the lamination process and eventually give rise to defects in the embedded oxide layer in the SOI structure.

We have invented a method for preventing these adverse effects. To be specific, this invention concerns a SOI substrate intended for solving the problems mentioned above and a method for the production thereof, which comprises the following means.

According to this invention, there can be provided a SOI substrate other than SIMOX allowing the presence of an embedded oxide film in a silicon single crystal substrate and characterized by satisfying at least either of the following conditions:

(a) The density of pit-like defects observed from the surface of the SOI layer is not more than 5 $cm^{-2}$ or (b) The density of pinhole defects in the embedded oxide layer is less than one piece/$cm^2$.

Further, according to this invention, there can be provided a SIMOX substrate characterized in that the density of pit-like defects observed from the surface of a SOI layer is not more than 5 $cm^{-2}$.

In addition, according to this invention, there can be provided a method for the production of a SOI substrate characterized by forming a SOI structure by using at least either of the following silicon single crystal substrates:

(a) A silicon single crystal substrate wherein the region to be involved in the formation of the SOI structure has a density of defects of not more than $1\times10^5$ cm$^{-3}$ or (b) A silicon single crystal substrate wherein voids and/or COP measuring not less than 0.1 μm as reduced to diameter are absent at least in the region from the surface to a depth for forming an embedded oxide layer.

Figure 1:
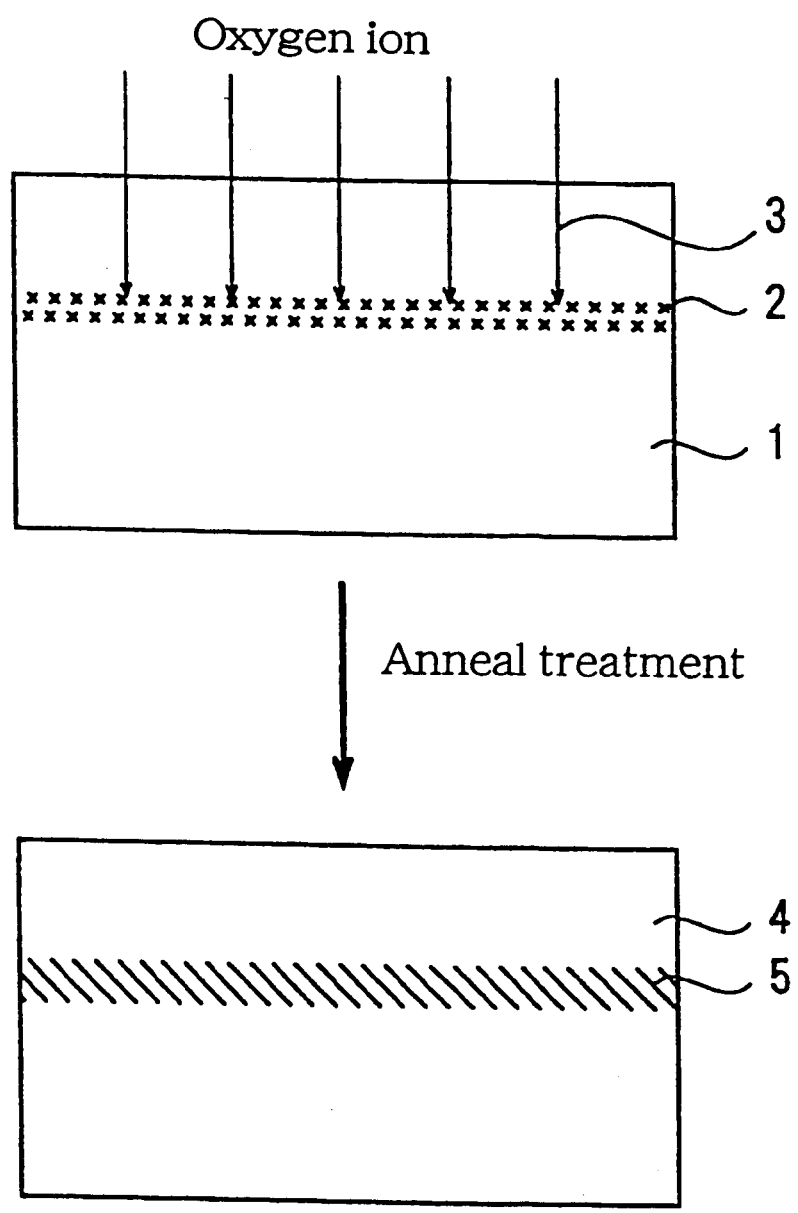
FIG. 1 is an explanatory diagram illustrating a process used in one example of this invention.

BEST MODE OF CARRYING OUT THE INVENTION (1) Pit-like Defects

By forming a MOS-LSI on a SOI substrate and a SIMOX substrate according to this invention, it is possible to produce a high-performance device in a high yield through the following function.

Specifically, by forming a MOS device on a SOI substrate in which the density of pit-like defects observed in a SOI layer through the surface thereof is small, it is possible to lower the ratio of the occurrence of defects in a gate oxide film. As regards this effect, when the whole or part of the gate oxide film of the MOS device overlaps pit-like defects, the property of the dielectric withstanding is deteriorated by such causes as the concentration of electric field at the parts of defects, the uneven growth of an oxide film, and the aggravation of defects in the oxide film. By using a SOI substrate having a low density of pit-like defects, therefore, it is possible to repress the deterioration of voltage resistance of such a gate oxide film. By the same token, in the process of lithography which is utilized for the production of MOS-LSIs, the possibility that the deviation of a focal point will be caused by the presence of locally uneven film thickness is reduced. Further, by the absence of the embedded oxide film from the portions of pit-like defects, the occurrence of a defective electric operation caused by the short circuit formed between the device formed in the SOI layer and the substrate is repressed. Further, by the absence of the SOI layer from the portions of the pit-like defects in the surface, it is possible to repress the occurrence of a defect due to the fact that the device, i.e. a component of the LSI, that ought to have been produced there is not formally formed.

Now, the method for investigating the surface density of pit-like defects and the effect brought thereby on the device characteristics will be described below. Specifically, MOS diodes are manufactured on SOI substrates containing pit-like defects in varying degrees of density and the gate electrodes thereof are tested for voltage-current characteristic.

SIMOX wafers were used as SOI substrates so prepared, for example, and these SIMOX wafers were divided into three groups by the difference in the density of pit-like defects observed on the surface.

The wafers of Group A contained pit-like defects observable on the surface at densities in the range of 10–20 pieces cm$^{-2}$, The wafers of Group B contained such pit-like defects at densities in the range of 1–5 pieces cm$^{-2}$, and The wafers of Group C contained such pit-like defects at densities of not more than one piece cm.

The pit-like defects in the SOI layer of a given SIMOX wafer were determined with an optical microscope. The observation thereof can be otherwise attained by a surface irregularity measuring device such as, for example, an atomic force microscope (AFM) and a light scattering type foreign particle meter. Alternatively, the pit-like defects maybe visualized by chemical etching or electrode position analysis of Cu and then determined.

The pit-like defects which were observed with the optical microscope were squares of sides in the approximate range of 1–10 μm or circles of diameters in the approximate range of 1–10 μm. The shape of the observed pit-like defects depends on the face bearing of a silicon single crystal to be used and the conditions of a heat treatment.

On these SIMOX wafers, a total of 290 MOS diodes having a gate oxide film 250 nm in thickness and a gate electrode 1 mm$^2$ in area were manufactured within the face. First, the gate oxide films of these MOS diodes were tested for the time zero dielectronic breakdown (TZDB) characteristic. The TZDB values were determined by gradually increasing the voltage applied to the gate and finding the electric field in which the value of the leak current through the gate oxide film reached $10^{-6}$ A/cm. A MOS diode found to have the electric field of not less than 8 MV/cm was rated as a sample excelling in dielectric withstanding.

The MOS diodes formed on the SIMOX wafers belonging to Group A were found to include samples of conforming dielectric withstanding at a ratio of about 80%. In contrast, the MOS diodes on the SIMOX wafers belonging to Group B and Group C were invariably found to include conforming samples at ratios both exceeding 95%.

It has been known that for the purpose of enabling the individual devices used for the formation of MOS-LSIs on the SIMOX wafers to secure fully satisfactory insulation resistance and preclude occurrence of inferior manufacture of LSIs due to inferior insulation, the MOS diodes are required to include samples of conforming insulation resistance at a ratio of not less than 90%. By forming the MOS-LSIs on the SIMOX wafers belonging to Group B and Group C, therefore, it is possible to obtain products of acceptable quality in a high yield. To be specific, products of high reliability can be obtained in a high yield by forming the MOS-LSIs on the SIMOX wafers containing pit-like defects observable from the surface at a density of not more than 5 cm$^{-2}$. Even on the SOI substrates obtained by the other processes including the lamination process, products of high reliability are obtained in a high yield by forming MOS-LSIs on SOI substrates containing pits observable from the surface at a density of not more than 5 cm$^{-2}$ owing to the same effect as described above.

The MOS diodes formed on the SIMOX wafers of Group B and Group C showed satisfactory results evinced by an invariably high ratio of acceptability of 95% found by the TZDB rating and showed no difference between the wafer groups. So these MOS diodes were rated for the time dependent dielectronic breakdown (TDDB) characteristic for the purpose of further comparison. The TDDB characteristic was determined by continuing application of a voltage to the gate electrode till the leak current through the gate oxide film of the MOS diode reached a stated magnitude and finding the amount of an electric charge fed until the gate oxide film was finally broken. It was rated by the amount of the electric charge. As a result of the test, it was found that the MOS diodes formed on the SIMOX wafers of Group C showed better TDDB characteristic than those formed on the SIMOX wafers of Group B.

It has been known that when the MOS-LSIs are formed with wafers of better TDDB characteristic, the gate oxide films of the devices acquire higher reliability. It has been shown particularly that very thin oxide films for use in very fine MOSFETs of high-integration LSIs enjoy a prominent improvement in insulating property. By forming MOS-LSIs on SIMOX wafers of Group C, therefore, it is possible to obtain products of high reliability in a high yield. Particularly, the devices furnished with very thin gate oxide films corresponding to LSIs of a high degree of integration enjoy a further addition to reliability.

Specifically, products of high reliability can be obtained in a high yield by forming MOS-LSIs on SIMOX wafers containing pit-like defects observable from the surface at a density of not more than 5 cm$^{-2}$. With SIMOX wafers containing pit-like defects observable from the surface at a density of not more than 1 cm$^{-2}$, MOS-LSI products of high reliability are obtained in a higher yield. In particular, devices furnished with very thin gate oxide films corresponding to more high-integration LSIs are enabled to confer increased reliability on their gate oxide films. This fact holds good with SOI substrates produced by other processes including the lamination process. That is, by forming MOS-LSIs on SOI substrates containing pit-like defects at a density of not more than 5 cm$^{-2}$ observable from the surface, it is possible to obtain products of high reliability in a high yield. Further, with SOI substrates containing pit-like defects at a density of not more than 1 cm$^{-2}$ observable from the surface, MOS-LSI products of high reliability are obtained in a still higher yield. In particular, devices which are furnished with very thin gate oxide films corresponding to high-integration LSIs are enabled to confer improved reliability on their gate oxide films.

Similarly in the preceding description concerning the improvement of gate oxide films in reliability, by using SOI substrates incorporating SIMOX wafers which contain pits observable from the surface at a density of not more than 5 cm$^{-2}$, it is possible to reduce the possibility that the deviation of a focal point will be caused by the presence of locally uneven film thickness in the process of lithography which is utilized for the production of a MOS-LSI. That is, the use of SOI substrates containing pits at a density of not more than 1 cm$^{-2}$ reduces to a greater extent the possibility of inducing deviation of a focal point and represses the occurrence of the deviation of a focal point particularly in the lithography of high accuracy which is used in the production of LSIs of a still higher degree of integration. The same effect can be expected in repressing the occurrence of an inferior electric operation caused by the fact that the absence of the embedded oxide film in the portions of surface pits produces a short circuit between the device produced in the SOI layer and the substrate and in repressing the occurrence of a disadvantage due to the fact that a device as a component of the LSI which ought to have been formed there is not normally formed.

The pit-like defects are not particularly restricted, but such pit-like defects that measure 0.7–100 $\mu m^2$ in size must be given due attention. When those of the pit-like defects which would affect the LSI characteristics on the SOI substrates were observed, they were found to measure 0.7–100 $\mu m^2$ in size. It is thought that the pit-like defects which measure less than 0.7 $\mu m$ in size deform and occasionally fade out during the formation of a SOI structure and bring only a small effect on the LSI characteristics on the SOI substrate. Conversely, the pit-like defects surpassing 100 $\mu m^2$ in size are formed by a cause different from the cause responsible for the pit-like defects measuring 0.7–100 $\mu m^2$ in size and bring a different effect on the LSI characteristics on the SOI substrate.

This invention, for the sake of a method of obtaining a SOI substrate containing such pit-like defects at a low density, advocates choosing, in a silicon single crystal immediately prior to the formation of a SOI structure, a region to be involved in the formation of a SOI structure on the condition that the density of defects therein be not more than 1×10$^5$ cm$^{-3}$. The reason for this choose is that when the silicon crystal ready for the formation of a SOI structure contains crystal defects, it will form a cause for the pit-like defects to be produced in the subsequent formation of the SOI structure. When a SIMOX substrate serves as a SOI substrate, for example, the region to be involved in the formation of the SOI structure means a depth from the surface of the silicon crystal which is decided by the conditions of production of the SIMOX wafer, specifically the region which is fixed by the depth of the largest concentration of oxygen introduced by ion injection and the thickness of the oxide film. When the energy for ion injection is 180 KeV and the amount of ions injected is 4×10$^{17}$ cm$^{-2}$ as often adopted, for example, the depth of the largest concentration of the injection oxygen ions is 0.435 $\mu m$ and the thickness of the embedded oxide film formed during the course of the heat treatment subsequent to the ion injection is 0.08 $\mu m$. In this case, the region to be involved in the formation of the SOI structure is generally preferred to range from the surface of the silicon crystal to a depth of 0.515 $\mu m$, particularly 0.5 $\mu m$. When the density of defects in this region is not more than 1×10$^5$ cm$^{-3}$, the surface density of defects to be contained in this region is not more than 5 pieces cm$^{-2}$. Further, when the region to be involved in the formation of a SOI structure in the silicon single crystal immediately prior to the formation of the SOI structure contains defects at a density of not more than 2×10$^4$ cm$^{-3}$, the pit-like defects observed from the surface after the formation of the SOI structure have a density of not more than one piece cm$^{-2}$.

That is, by lowering the density of defects in the region of the silicon single crystal immediately prior to the formation of a SOI structure below 1×10$^5$ cm$^{-3}$, it is possible to improve the electric characteristic such that the MOS-LSI to be formed on the substrate after the formation of SOI structure will be produced with high reliability in a high yield, for example. Further, when the region to be involved in the formation of a SOI structure in the silicon single crystal immediately prior to the formation of a SOI structure contains defects at a density of not more than 2×10$^4$ cm$^{-3}$, the characteristics of the MOS-LSI to be formed on the substrate after the formation of SOI structure will be improved to a greater extent. In particular, in the device furnished with a very thin gate oxide film and corresponding to the LSI of high degree of integration, the gate oxide film is improved in reliability.

The effect of the operation described above can be expected to achieve particularly when a SIMOX substrate is adopted as the SOI substrate. Specifically, by lowering the density of defects in the region to be involved in the formation of a SIMOX structure in the silicon single crystal immediately prior to the formation of the SIMOX structure below 1×10$^5$ cm$^{-3}$, it is possible to improve the characteristics of the MOS-LSI to be formed on the SIMOX subsequently to the formation thereof. Similarly, when a SIMOX structure is formed in the silicon single crystal in which the region contains defects at a density of not more than 2×10$^4$ cm$^{-3}$, the MOS-LSI formed thereon will be able to manifest exceptionally fine characteristics. Then, the device furnished with an extremely thin gate oxide film and corresponding to the LSI of a higher degree of integration is enabled to enhance the reliability of the gate oxide film thereof.

The method for the formation of the SOI substrate is preferred to be a method for producing a SIMOX substrate by using, as main steps thereof, the injection of oxygen ions into the surface of a silicon single crystal and the subsequent performance of an annealing treatment.

Of the defects of the silicon single crystal immediately prior to the formation of the SOI structure, those of dislocation, void, oxygen precipitate, and/or COP require to be given due attention.

The dislocation in a silicon substrate prior to the formation of a SOI structure, owing to the strain caused by the dislocation of itself and the presence of impurities brought by the gettering of the dislocation, inevitably forms pits through abnormal oxidation during the course of formation of SOI. The voids are cavities arising from the absence of silicon atoms from the silicon substrate. When these voids are present in the silicon crystal prior to the formation of the SOI structure and they happen to be drawn in the SOI layer during the course of forming the SOI structure, they grow and manifest themselves as pit-like defects in the surface region of the SOI layer. When an oxygen precipitate is present in the silicon crystal prior to the formation of a SOI structure, it is grown and deformed during the step of forming the SOI structure and, by surface oxidation or washing with hydrofluoric acid after the step of polishing, is converted into surface pits and suffered to deteriorate the characteristics of the device formed there. The COP is one kind of fine pits which are determined by a light scattering type surface foreign particle meter. When it is present in the region to be involved in the formation of a SOI structure in the wafer ready for the formation of the SOI structure, it is deformed during the formation of the SOI structure and turned into pit-like defects on the surface. The surface pits caused by the COP of this quality persists as a surface irregularity which will impair the characteristics of a device formed there.

This effect can occur in the SOI substrates without reference to the kinds of method used for their production. In particular, the SIMOX wafer process requires to be given due attention because it entails the injection of oxygen ions at a high dose and the performance of a heat treatment at an elevated temperature and, therefore, suffers various factors to deform the surface pits conspicuously.

The silicon single crystal substrate as the starting material for the formation of the SOI structure is only required to satisfy the quality mentioned above and is not particularly restricted on account of the kind of method used for the production thereof. Specifically, a wafer having an epitaxial layer of silicon not less than 0.1 $\mu$m in thickness on the surface of a single crystal silicon substrate may be used. A single crystal silicon substrate which has been annealed in an atmosphere of rare gas having an impurities content of not more than 5 ppm at a temperature of not less than 1000° C. and not more than 1300° C. for a period of not less than one hour may be used alternatively. Otherwise, a wafer of single crystal silicon grown by the Czochralski process at a pulling speed of not more than 0.8 mm/min, for example, may be used. It is also permissible to use, for example, a wafer which has been obtained by pulling and growing a silicon single crystal by the Czochralski process under conditions such that a region in which the cooling speed falls below 1.0° C./min. occurs in the range of crystallizing temperature of 1200–1000° C. Further, a silicon wafer containing nitrogen as an impurity at a concentration of not less than $1\times10^4$ atoms/cm$^3$ and not more than $1\times10^{18}$ atoms/cm$^3$ may be used.

This invention, as described above, is enabled to provide a semiconductor substrate which is capable of producing a high-performance LSI with high reliability by utilizing a SOI substrate containing pit-like defects at a small density in the SOI layer. Similarly with a SIMOX wafer containing pit-like defects at a low density in the SOI layer, a high-performance LSI can be produced with high reliability. The SOI substrate containing pit-like defects at a low density in the SOI layer can be obtained by using a silicon crystal which, prior to the formation of the SOI structure contains defects at a density below a fixed level.

(2) Pinhole Defects

In the SOI substrate to be used, the embedded oxide layer has a thickness of about 0.1 $\mu$m or about 0.4 $\mu$m and the SOI layer has a thickness of not more than 0.3 $\mu$m in the case of a SIMOX wafer. In the case of a laminated substrate, the embedded oxide layer has a thickness in the range of 0.2 $\mu$m–0.4 $\mu$m and the SOI layer has a thickness in the approximate range of 1 $\mu$m to 0.2 $\mu$m, though adjustable relatively freely.

In consequence of the recent advance of the LSI technology, the practice of using a SIMOX substrate having an embedded oxide layer of a thickness of about 0.1 $\mu$m which, because of a short duration of ion injection, excels in SOI layer quality and in cost as well has been in vogue. Also in the case of a laminated substrate, the practice of using such a substrate having an embedded oxide layer of a thickness of about 0.2 $\mu$m has been finding popular acceptance. In consequence of the reduction in thickness of the embedded oxide layer, the importance of securing expected qualities including insulating property has come to find popular recognition.

When a MOS-LSI is formed on a SIMOX substrate or a SOI substrate, i.e. a laminated substrate, according to this invention, since the region for forming a device is fully insulated from the substrate proper by an embedded oxide layer having secured the insulating properly in a high yield, a device of high performance excelling in resistance to radiation and resistance to latch-up and producing an operation with a low power consumption can be manufactured in a high yield. The pinholes in the embedded oxide layer, therefore, form a cause for lowering the yield. Since the device generally comes in a chip size in the approximate range of 1 mm$^2$–1 cm$^2$, inferior insulation occurs frequently between the device and the substrate proper and the device suffers a marked reduction in the yield when the embedded oxide film contains pinholes at a density of not less than one piece/cm$^2$.

Of the defects in the silicon single crystal immediately prior to the formation of a SOI structure, those in the form of voids and/or COP must be given due attention. The voids are cavities produced by the absence of silicon atoms from the silicon substrate. When these voids are present in the silicon crystal prior to the formation of a SOI structure, they have the possibility of generating defects in the embedded oxide layer to be consequently formed because they affect the distribution in the direction of depth of the oxygen ions to be injected in the case of producing a SIMOX substrate or because they give rise to defects in the surface oxide layer in the case of producing a laminated substrate. The COP is a kind of fine pits which are determined with a light scattering type surface foreign particle meter. When it is present in the region to be involved in the formation of a SOI structure in a wafer prior to the formation of the SOI structure, it has the possibility of giving rise to defects similarly in the embedded oxide layer because it affects the distribution in depth of the oxygen ions injected during the course of production of the SIMOX substrate or because it produces a thickness distribution in the surface oxide layer in the case of producing a laminated substrate.

It is known that a typical silicon wafer manufactured by the Czochralski process and generally used for the production of LSIs contains voids not less than 0.1 μm in size at an approximate density of $1\times10^{-5}$ cm$^{-3}$ and COP not less than 0.1 μm at an approximate density of one piece/cm$^2$. When a SOI substrate is manufactured by using such a silicon wafer, the embedded oxide layer is to generate defects owing to the effect mentioned above. In the case of a SOI substrate furnished with an embedded oxide layer having such a fine thickness of about 0.1 μm, the effects of the voids and the COP alone are enough to induce inevitable generation of defects of the order of one piece/cm$^2$ in the embedded oxide layer. Then, it is no longer possible to form a SOI substrate more excellent than the wafer having an embedded oxide layer in terms of density of defects.

For the purpose of reducing the density of pinhole defects in the embedded oxide layer of the SOI substrate, therefore, it is necessary to reduce such voids and/or COP. The voids and/or COP subjected to the reduction under discussion ought to be those which measure not less than 0.1 μm in size because the SOI layer and the embedded oxide layer in the SOI structure both measure about 0.1 μm or more in thickness. It may use a silicon wafer in which the voids and/or COP of the size are absent at least in the region from the surface to the depth allowing the formation of the embedded oxide layer.

The silicon single crystal substrate as the starting material for the formation of the SOI structure is only required to satisfy the quality mentioned above and is not particularly restricted on account of the kind of method used for the production thereof. Specifically, a wafer having an epitaxial layer of silicon not less than 0.4 μm in thickness for the production of a SIMOX substrate or 0.1 μm in thickness for the production of a laminated substrate on the surface of a single crystal silicon substrate may be used, for example. A single crystal silicon substrate which has been annealed in an atmosphere of rare gas having an impurities content of not more than 5 ppm at a temperature of not less than 1000° C. and not more than 1300° C. for a period of not less than one hour may be used alternatively. Otherwise, a wafer of single crystal silicon grown by the Czochralski process at a pulling speed of not more than 0.8 mm/min, for example, may be used. It is also permissible to use, for example, a wafer which has been obtained by pulling and growing a silicon single crystal by the Czochralski process under conditions such that a region in which the cooling speed falls below 1.0° C./min. occurs in the range of crystallizing temperature of 1200–1000° C. Further, a silicon wafer containing nitrogen as an impurity at a concentration of not less than $1\times10^{14}$ atoms/cm$^3$ and not more than $1\times10^{18}$ atoms/cm$^3$ may be used.

The conditions for the production of the SOI substrate are not particularly restricted except for a silicon wafer described above. In the conditions for the production of the SIMOX substrate, for example, the accelerating voltage in the range of 180 keV–200 keV is generally used as the condition for oxygen injection. The voltage, when necessary, may be higher or lower than the range mentioned above. When the accelerating voltage of 180 keV is used, for example, the dose of oxygen ions is preferred to be about $4\times10^{17}$ cm$^{-2}$ or $1.3\times10^{18}$ cm$^{-2}$ from the viewpoint of the electric pressure resistance property. The effect of reducing the pinholes in the oxide film can be expected even when the dose deviates from this range. As respects the annealing conditions, it is commendable to use a temperature of not less than 1300° C. for the purpose of obtaining an embedded oxide film of high quality. The temperature, when necessary, may be lower than this level. The atmosphere enclosing the site of annealing may be either oxidative or not oxidative.

The method for the production of a laminated substrate is preferred to comprise a step of forming a thermal oxidation layer on the surface of two silicon single crystal substrates being used, a step of subsequently laminating the substrate with the remaining substrate, and a step of polishing the substrate having formed the thermal oxidation layer from the side not used for union by the lamination. As respects the conditions for the production of laminated crystals, the temperature in the neighborhood of 1000° C. is generally used as the condition of oxidation for the production of an embedded oxide layer. The temperature, when necessary, may be higher or lower than the level. The atmosphere enveloping the site of oxidation may be dry or wet. The partial pressure of oxygen is not particularly restricted.

The present invention, as described above, can provide a semiconductor substrate which enables a LSI of high performance to be produced with high reliability by utilizing a SOI substrate containing defects in an embedded oxide layer at a low density. The SOI substrate containing defects in an embedded oxide layer at a low density can be obtained by using a silicon crystal containing defects at a density below a stated level prior to the formation of a SOI structure.

EXAMPLES

Now, concrete examples of this invention will be described below.

Example 1

Pit-like Defects

FIG. 1 depicts a method for the production of a SIMOX substrate (in cross section) according to this example.

Silicon single crystal wafers 1 belonging to Group A containing defects in a single crystal wafer 1 prior to injection of oxygen ions at a density in the range of $1-2\times10^6$ cm$^{-3}$, Group B similarly containing defects at a density in the range of $0.2-1\times10^5$ cm$^{-3}$, and Group C similarly containing defects at a density in the range of $2-10\times10^3$ cm$^{-3}$ each had an injection of oxygen ions (oxygen ion beam 3) at a dose of $4\times10^{17}$ cm$^{-2}$ with an injection energy of 180 keV to form a high-concentration of oxygen ion injection layer 2 thereon and subsequently annealed at 1350° C. for seven hours to obtain a SIMOX substrate. The SIMOX substrates thus obtained had a structure having a SOI layer 4 formed on an embedded oxide film 5. The density of defects in a single crystal silicon wafer 1 prior to the injection of oxygen ions was determined by immersing a test wafer produced in the same batch as a given CZ wafer used for forming the SIMOX structure in a Secco etching solution and reckoning flow pattern defects (FPD) consequently appearing on the etched surface of the test wafer and computing the density.

In the examination of the surfaces of the completed SIMOX wafers with an optical microscope, the SIMOX structures formed on the wafers of Group A were observed to have surface pits formed at densities in the approximate range of 10–20 pieces cm$^{-2}$ on their SOI layers 4. In contrast, the SIMOX structures formed on the wafers of Group B were observed to have surface pits formed at densities in the range of 2–5 pieces cm$^{-2}$ on their SOI layers 4 and those formed on the wafers of Group C were observed to have surface pits formed at densities in the range of 0–1 piece cm$^{-2}$ on their SOI layers 4.

MOS diodes were formed on such SIMOX wafers and were tested for TZDB and TDDB characteristics. To be used in the test for the TZDB characteristic, 290 MOS diodes having a gate oxide film 250 nm in thickness and a gate electrode 1 mm² in area were manufactured in a 6-inch wafer plane. The characteristic was determined by gradually increasing the voltage applied to a gate and measuring the electric field when the leak current of the gate oxide film reached a magnitude of $10^{-6}$ A/cm. The MOS diodes found to have electric fields of not less than 8 MV/cm were rated acceptable in terms of dielectric withstanding. The ratios of samples showing acceptable insulation were compared. In the case of the MOS diodes formed on the SIMOX wafers belonging to Group A, the ratio of acceptable products was about 80%. In contrast, in the case of the MOS diodes formed on the SIMOX wafers belonging to Group B and Group C, the ratios of acceptable products were both not less than 95%.

Then, the MOS diodes formed on the SIMOX wafers were tested for the TDDB characteristic. The MOS devices used for the test had a gate diode film 6.5 nm in thickness and a gate electrode 10 mm² in area. The TDDB characteristic was determined by continuously applying a gate voltage for fixing the gate leak current at 5 m/cm² and measuring the total electric charge fed to the gate oxide film till the gate oxide film broke. The difference in the total electric charge served as the index for rating the characteristic. To the MOS diodes on the SIMOX wafers belonging to Group A, those which broke at a total charge of 1 c/cm² accounted for a ratio of not less than 60–80%. In contrast, the MOS diodes of Group B which similarly broke accounted for a ratio of 8–15% and those of Group C which similarly broke accounted for a ratio of 1–3%.

It is clear from these results that when the region in a single crystal silicon substrate immediately prior to the formation of a SOI structure, which is involved in the formation of the SOI structure, contains defects at a low density when the SOI structure is formed, the density of pit-like defects observed from the surface of the SOI substrate after the formation of the SOI structure is reduced, and that when MOS-LSIs are formed on these SOI substrates, they acquire further improvement in electric characteristic.

Example 2

Pinhole Defects

Three kinds of silicon wafers differing in density of voids and COP measuring not less than 0.1 μm and existing to a depth of 0.5 μm from the surface as shown in Table 1 below were prepared. These wafers were used for producing SIMOX substrates and laminated substrates. The wafers A and B were silicon wafers manufactured by the ordinary CZ process, and the wafers C were silicon wafers manufactured at a pulling speed of 0.4 mm/min. As the conditions for producing the SIMOX substrate, the accelerating voltage for the injection of oxygen ions was set at 180 keV and the amount of oxygen ions injected at $4\times10^{17}$ cm⁻². The annealing was performed in an atmosphere of argon plus 0.5% oxygen at a temperature of 1350° C. for six hours. The resultant SIMOX substrate was composed of a SOI layer 0.3 μm in thickness and an embedded oxide layer 0.1 μm in thickness. In the production of the laminated substrate, a thermal oxidation layer 0.2 μm in thickness was formed by wet oxidation at a temperature of 1000° C. on one of the wafers. Subsequently, this wafer was combined with the other wafer and they were together heat-treated in an atmosphere of nitrogen at a temperature of 1100° C. Thereafter, the wafer having formed the thermal oxidation layer thereon was polished from the side opposite the side used for the combination to reduce the SOI layer to a thickness of 0.2 μm.

The SIMOX substrates and the laminated substrates thus produced were immersed in a plating liquid containing copper ions in such a manner that the obverse surfaces of substrate alone contacted the liquid, with the reverse surfaces of substrate held in contact with an electric cathode and the electric anode disposed in the plating liquid. Thereafter, by applying between the two electrodes a low voltage of about 10 V incapable of breaking the embedded oxide layer itself, copper was electrolytically deposited on the surface of the substrate directly above the portions of the embedded oxide layer containing pinholes. The density of pinholes in the embedded oxide layer was determined by reckoning the produced spots of deposite. The results are shown in Table 1 in conjunction with the density of void defects found in the silicon wafer.

TABLE 1

| Wafer | (1) | (2) SIMOX substrate | (2) Laminated substrate | Remarks |
|---|---|---|---|---|
| A | $1 \times 10^6$ | 8.0 | 4.1 | Comparative |
| B | $3 \times 10^4$ | 2.8 | 1.5 | Example |
| C | 0 | 0.2 | 0 | Example | wherein (1) Density of voids or COP measuring not less than 0.1 μm and existing to a depth of 0.5 μm from surface (cm⁻³), and (2) Density of pinholes in embedded oxide layer (cm⁻²).

It is clear from Table 1 that the density of pinholes in the embedded oxide layer was distinctly low in the wafers of Group C having no void defects. This fact indicates that by reducing the density of void defects in a silicon wafer, it is possible to reduce the pinholes in the embedded oxide layers of the SIMOX substrate and the laminated substrate produced by using the silicon wafer.

In Table 1, even on the wafer having 0 for the density of voids, the density of pinhole defects in the embedded oxide layer of the SIMOX substrate is not 0. This fact may be logically explained by a supposition that the injection of oxygen ions is obstructed by the particles adhering to the surface of the wafer during the injection of oxygen ions.

What is claimed is:

1. A SOI substrate other than SIMOX allowing the presence of an embedded oxide film in a silicon single crystal substrate and comprising satisfying the following conditions:

shape of pit-like defects observed from the surface of the SOI layer is a square or circle determined with an optical microscope, the density thereof being not more than 5 defects per square cm, each pit-like defect having an area in a range of 0.7–100 μm²;

wherein a SOI structure is formed by using the following silicon single crystal substrate:

a silicon single crystal substrate wherein a void and/or COP measuring not less than 0.1 μm as reduced to diameter is absent from at least the region from the surface to the depth for forming an embedded oxide layer.

2. A method for the production of a SOI substrate, comprising forming a SOI structure by using the following silicon single crystal substrate:

a silicon single crystal substrate wherein a void and/or COP measuring not less than 0.1 μm as reduced to diameter is absent from at least the region from the surface to the depth for forming an embedded oxide layer.

3. A SIMOX substrate comprising containing pit-like defects observed from the surface of a SOI layer at a density of not more than 5 defects per square cm, the shape of the pit-like defects being a square or a circle determined with an optical microscope, each pit-like defect having an area in the range of 0.7–100 $\mu m^2$, wherein a SOI structure is formed by using a silicon single crystal substrate wherein a void and/or COP measuring not less than 0.1 $\mu$m as reduced to a diameter is absent from at least the region from the surface to the depth for forming an embedded oxide layer.

4. A method for the production of a SOI substrate, comprising forming a SOI structure by using a silicon single crystal substrate wherein the region to be involved in the formation of a SOI structure has a density of defects of not more than $1 \times 10^5$ defects per cubic cm, the region ranging from a surface of the silicon crystal to a depth of 0.515 $\mu$m.

* * * * *